United States Patent
De Paula et al.

(10) Patent No.: US 11,481,534 B2
(45) Date of Patent: Oct. 25, 2022

(54) TRACE-BASED GENERATION OF STATES WITHIN A SYSTEM

(71) Applicant: International Business Machines Corporation, Armonk, NY (US)

(72) Inventors: Flavio M. De Paula, Austin, TX (US); Bradley D. Bingham, Austin, TX (US); Arvind Haran, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 800 days.

(21) Appl. No.: 16/295,734

(22) Filed: Mar. 7, 2019

(65) Prior Publication Data

US 2020/0285712 A1 Sep. 10, 2020

(51) Int. Cl.
G06F 9/44 (2018.01)
G06F 30/33 (2020.01)

(52) U.S. Cl.
CPC .................... *G06F 30/33* (2020.01)

(58) Field of Classification Search
CPC .......... G06F 17/50; G06F 11/273; G06F 9/44; G06F 9/45; G06F 30/33; G06F 30/3308
See application file for complete search history.

(56) References Cited

U.S. PATENT DOCUMENTS

| | | | |
|---|---|---|---|
| 8,417,998 | B2 | 4/2013 | Thomas et al. |
| 9,143,176 | B2 | 9/2015 | Wax et al. |
| 2018/0203786 | A1 | 7/2018 | Marron et al. |

OTHER PUBLICATIONS

Kamdem et al. Efficiently Rewriting Large Multimedia Application Execution Traces with few Event Sequences ACM 978-14503-2174-7/13/08 (Year: 2013).*
Pirzadeh et al. A Novel Approach Based on Gestalt Psychology for Abstracting the Content of Large Execution Trace for Program Comprehension IEEE International Conference on Engineering of Complex Computer Systems 2011 (Year: 2011).*
De Paula, F.M. et al., "An Efficient Rewriting Framework for Trace Coverage of Symmetric Systems," NASA Formal Methods Symposium, 2018.
Kamdem Kegne, C. et al., "Efficiently Rewriting Large Multimedia Application Execution Traces with few Event Sequences," Proceedings of the 19th ACM SIGKDD international conference on Knowledge discovery and data mining, 2013.
Bordin, M. et al., "Object and Source Coverage for Critical Applications with the Couverture Open Analysis Framework," Embedded Real Time Sofware and Systems Conference, 2010.
Cunha, A. et al., "Transformation for structure-shy programs with application to XPath queries and strategic functions," Science of Computer Programming, vol. 76, No. 6, 2011.

* cited by examiner

*Primary Examiner* — Rehana Perveen
*Assistant Examiner* — Cuong V Luu
(74) *Attorney, Agent, or Firm* — Scully, Scott, Murphy & Presser, P.C.

(57) ABSTRACT

A method, computer program product, and a computer system are disclosed for providing a trace abstraction framework to compute trace-based functional coverage models that in one or more embodiments receive a set of traces; rewrite a trace of the set of traces into a second trace; abstract the second trace; rewrite the abstracted second trace; and generate an abstract trace representative the trace of the set of traces.

20 Claims, 6 Drawing Sheets

TRACE-BASED GENERATION OF STATES WITHIN A SYSTEM

BACKGROUND

The disclosure herein relates generally to design verification, and more particularly, to methods, apparatus, and products for generating a coverage model in a hardware simulation environment.

Verification coverage is an important metric in any hardware verification effort. Coverage models may include a set of events that the hardware may exhibit or may be possible under a test scenario. At the system level, the events may each correspond to a visited state or a taken-transition in a transition system that represents the underlying hardware. By knowing which events in the coverage model are covered or uncovered (i.e., a coverage hole), the user may obtain feedback on the test stimulus quality.

A more sophisticated verification approach involves checking that tests exercise specific sequences of events, corresponding to traces through the transition system. The sequences of events may allow for a more refined analysis of the system's behavior, rather than simply analyzing visited-states and/or taken-transitions. However, such trace-based coverage models are inherently expensive to implement in practice, as the number of traces grows in trace length, the coverage model exponentially grows, thereby making analysis of the coverage model impractical.

Typically on complex systems, the number of coverage-points is significantly large and extracting meaning from the large number of coverage points is difficult. For example, if two coverage-points were hit by a regression suite one million times and ten million times, respectively, it is difficult to determine if the first coverage-point needs more testing and if so, how much more testing. It can be determined that more tests are needed if a coverage-point was not at all hit. Thus, a large number of coverage-points serves as a double-edged sword, i.e., having more coverage points increases testing of various design features, but also makes analysis of the coverage-points more difficult. Moreover, some of the coverage-points may not be hittable, while others may be redundant as one coverage-point can imply another coverage-point. In both cases, these types of coverage points strain the design verification process by adding unnecessary tests and/or simulation cycles.

SUMMARY

The summary of the disclosure is given to aid understanding of a computer system, computer architectural structure, processor, and method of generating a trace-based coverage model in a hardware simulation environment, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the computer system, the architectural structure, processor, and their method of operation to achieve different effects.

According to one or more embodiments of the present disclosure, a method of providing a trace abstraction framework to compute trace-based functional coverage models includes receiving a set of traces. In one or more embodiments, the method includes rewriting a trace of the set of traces into a second trace. In one or more embodiments, the method includes abstracting the second trace. In one or more embodiments, the method includes rewriting the abstracted second trace. In one or more embodiments, the method includes generating an abstract trace representative of the trace from the set of traces.

According to one or more embodiments, trace-based apparatus for providing a trace abstraction framework to compute trace-based functional coverage models includes memory having program instructions embodied therewith, and at least one processor configured to read the program instructions. In an embodiment, the at least one processor is configured to read the program instructions to execute a trace abstraction unit configured to receive a set of traces, to rewrite a trace of the set of traces into a second trace, to abstract the second trace, to rewrite the abstracted second trace, and to generate an abstract trace representative of the trace from the set of traces.

According to one or more embodiments, a computer program product includes a non-transitory computer-readable storage medium having program instructions embodied therewith for providing a trace abstraction framework to compute trace-based functional coverage models. The program instructions may be executed by one or more processors. The program instructions in an embodiment includes receiving a set of traces. The program instructions in an embodiment includes rewriting a trace of the set of traces into a second trace. The program instructions in an embodiment includes abstracting the second trace. The program instructions in an embodiment includes rewriting the abstracted second trace. The program instructions in an embodiment includes generating an abstract trace representative of the trace from the set of traces.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

The various aspects, features and embodiments of a computer system, computer architectural structure, processor, and their method of operation will be better understood when read in conjunction with the figures provided. Embodiments are provided in the figures for the purpose of illustrating aspects, features, and/or various embodiments of the computer system, computer architectural structure, processors, and their method of operation, but the claims should not be limited to the precise arrangement, structures, features, aspects, assemblies, systems, embodiments, or devices shown, and the arrangements, structures, subassemblies, features, aspects, methods, processes, embodiments, and devices shown may be used singularly or in combination with other arrangements, structures, assemblies, subassemblies, systems, features, aspects, embodiments, methods and devices.

DETAILED DESCRIPTION

The following description is made for illustrating the general principles of the invention and is not meant to limit the inventive concepts claimed herein. In the following detailed description, numerous details are set forth in order to provide an understanding of the computer system, computer architectural structure, processor, and their method of operation, however, it will be understood by those skilled in the art that different and numerous embodiments of the computer system, computer architectural structure, processor, and their method of operation may be practiced without those specific details, and the claims and disclosure should not be limited to the embodiments, subassemblies, features, processes, methods, aspects, features or details specifically described and shown herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified, and that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following discussion omits or only briefly describes conventional features of information processing systems, including processors and microprocessor systems and architectures, which are apparent to those skilled in the art. It is assumed that those skilled in the art are familiar with the general architecture of processors, and in particular with processors which operate in an out-of-order execution fashion. It may be noted that a numbered element is numbered according to the figure in which the element is introduced, and is typically referred to by that number throughout succeeding figures.

Exemplary methods, apparatus, and products for design verification, and in particular, for generating a trace-based coverage model in a hardware simulation environment in accordance with the present disclosure are described further below with reference to the Figures.

Figure 1:
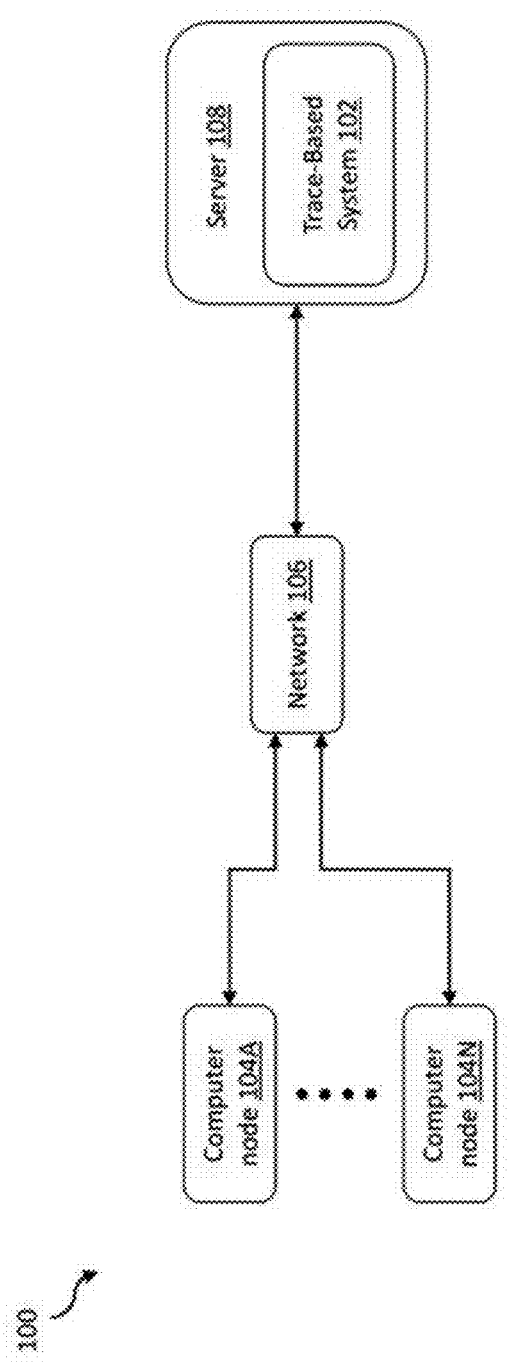
FIG. 1 is a functional block diagram illustrating a data processing environment, according to one or more embodiments of the present disclosure.

FIG. 1 is a functional block diagram illustrating a data processing environment 100, in accordance with one or more embodiments of the present disclosure. FIG. 1 provides only an illustration of one implementation and does not imply any limitations with regard to the environments in which different embodiments may be implemented. Many modifications to the depicted environment may be made by those skilled in the art without departing from the scope of the embodiments herein. Data processing environment 100 includes network 106, server 108, which operates the trace-based system 102, and one or more computer nodes, such as computer node 104A and computer node 104N.

Network 106 can be, for example, a local area network (LAN), a telecommunications network, a wide area network (WAN), such as the Internet, a virtual local area network (VLAN), or any combination that can include wired, wireless, or fiber optic connections. Network 106 can also include wire cables, wireless communication links, fiber optic cables, routers, switches and/or firewalls. Network 106 interconnects server 108, computer node 104A, and computer node 104N. In general, network 106 can be any combination of connections and protocols capable of supporting communications between server 108, computer node 104A, computer node 104N, and trace-based system 102.

Server 108 can be a web-based server hosting trace-based system 102, in accordance with embodiments of the disclosure. Server 108 may include one or more servers. In one or more embodiments, server 108 can be a web server, a blade server, a computer including one or more processors and at least one non-transitory computer readable memory, a mobile computing device, a laptop computer, a tablet computer, a netbook computer, a personal computer (PC), a desktop computer, or any programmable electronic device or computing system capable of receiving and sending data, via network 106, and performing computer-readable program instructions. In other embodiments, server 108 can be a data center, consisting of a collection of networks and servers providing an IT service, such as virtual servers and applications deployed on virtual servers, to an external party. In yet other embodiments, server 108 represents a computing system utilizing clustered computers and components (e.g., database server computer, application server computers, etc.) that act as a single pool of seamless resources, such as in a cloud computing environment, when accessed within data processing environment 100.

In some embodiments, server 108 includes a data storage repository (not shown) for storing data including, but not limited to, design under tests (DUTs), coverage models, simulation logs, and/or the results of a trace-based functional coverage, scoreboard, and/or coverage holes. Data storage repository can be one of, a web server, a mobile computing device, a laptop computer, a tablet computer, a netbook computer, a personal computer (PC), a desktop computer, or any programmable electronic device or computing system capable of receiving, storing, and sending files and data, and performing computer readable program instructions capable of communicating with server 108, computer node 104A, and computer node 104N, via network 106. In other embodiments, data storage repository can represent virtual instances operating on a computing system utilizing clustered computers and components (e.g., database server computer, application server computers, etc.) that act as a single pool of seamless resources when accessed within data processing environment 100.

In some embodiments, trace-based system 102 operates on a central server, such as server 108, and can be utilized by one or more computer nodes, such as computer node 104A and computer node 104N, via a mobile application downloaded from the central server or a third-party application store. In another embodiment, trace-based system 102 may be a software-based program, downloaded from a central server, such as server 108, and installed on one or more computer nodes, such as computer node 104A and computer node 104N. In yet another embodiment, trace-based system 102 can be utilized as a software service provided by a third-party cloud service provider (not shown).

In some embodiments, computer node 104A and computer node 104N are clients to server 108 and can be, for example, a desktop computer, a laptop computer, a tablet computer, a personal digital assistant (PDA), a smart phone, a thin client, or any other electronic device or computing system capable of communicating with server 108 through network 106. For example, computer node 104A and computer node 104N may be a desktop computer capable of connecting to a network, such as network 106, to access one or more components of the trace-based system 102. In other embodiments, computer node 104A and computer node 104N can be any suitable type of mobile devices capable of running mobile applications, including smart phones, tablets, slate, or any type of device that runs a mobile operating system. In yet other embodiments, computer node 104A and computer node 104N can represent virtual instances operating on a computing system utilizing clustered computers and components (e.g., database server computer, application server computers, etc.) that act as a single pool of seamless resources when accessed within data processing environment 100. In yet another embodiment, computer node 104A and computer node 104N can include a user interface (not shown) for providing an end user with the capability to interact with trace-based system 102.

In some embodiments, computer node 104A and 104N are capable of communicating with each other, with server 108, and with other computer nodes in a distributed cluster through network 106. In some embodiments, the computer nodes and server 108 can function as one or more clusters in a distributed system, via network 106, to operate trace-based system 102. In some embodiments, components of trace-based system 102 reside locally on server 108. In other embodiments, components of trace-based system 102, either individually or in various combinations, reside remotely from each other on server 108 and one or more computer nodes, such as computer node 104A and 104N, of the distributed clusters, in which the components are connected via network 106. In an embodiment, network 106 connects the one or more computer nodes of the distributed clusters.

Figure 2:
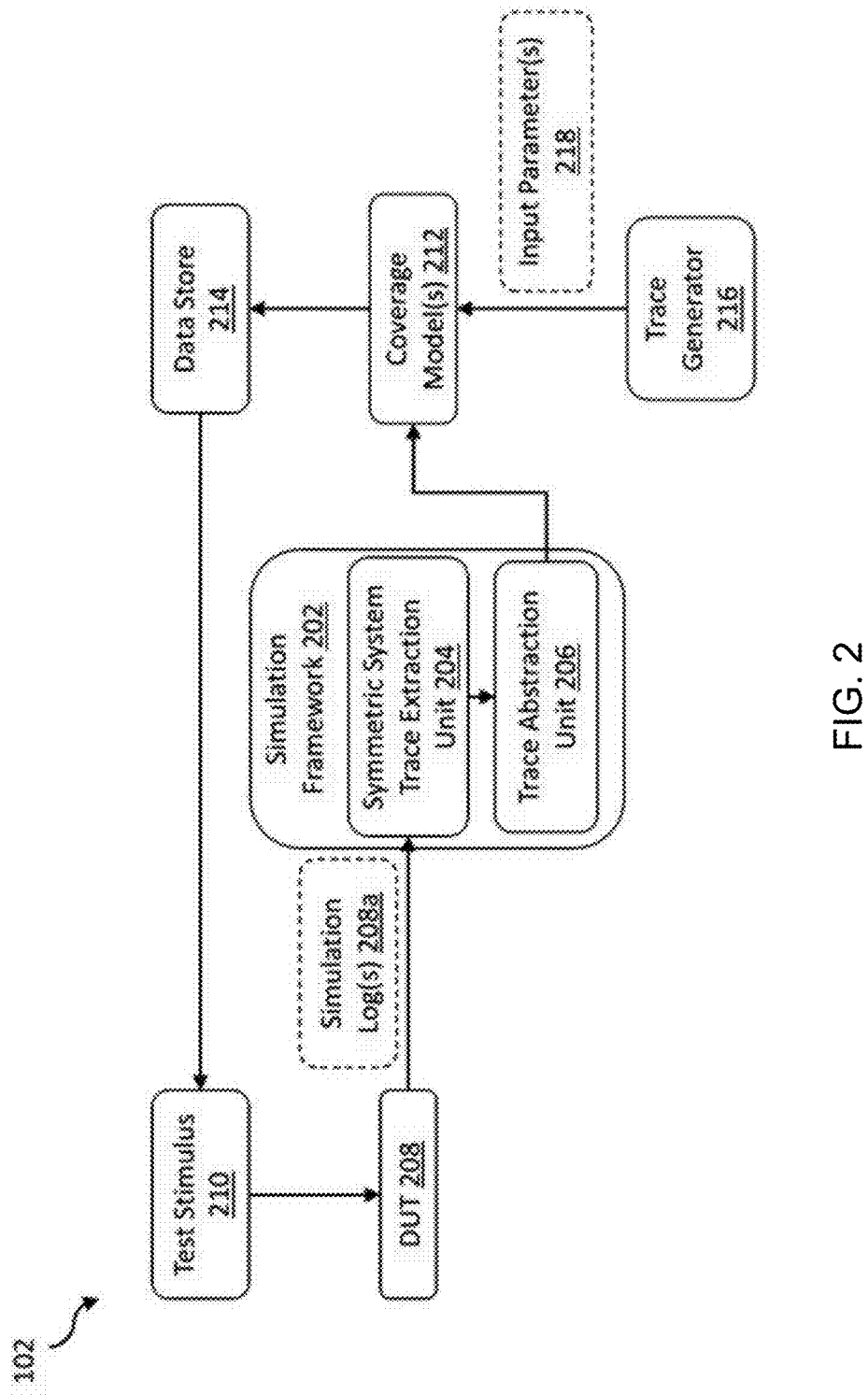
FIG. 2 is a functional block diagram illustrating components of a trace-based system, according to one or more embodiments of the present disclosure.

FIG. 2 is a functional block diagram illustrating components of the trace-based system 102, according to one or more embodiments of the present disclosure. In one or more embodiments, the trace-based system 102 includes a coverage tracking infrastructure having one or more components, such as a simulation framework 202, a design under test (DUT) 208, one or more coverage models 212, a data store 214, and one or more test stimuli 210. The simulation framework 202 may include a symmetric system trace extraction unit 204 and a trace abstraction unit 206.

Figure 6:
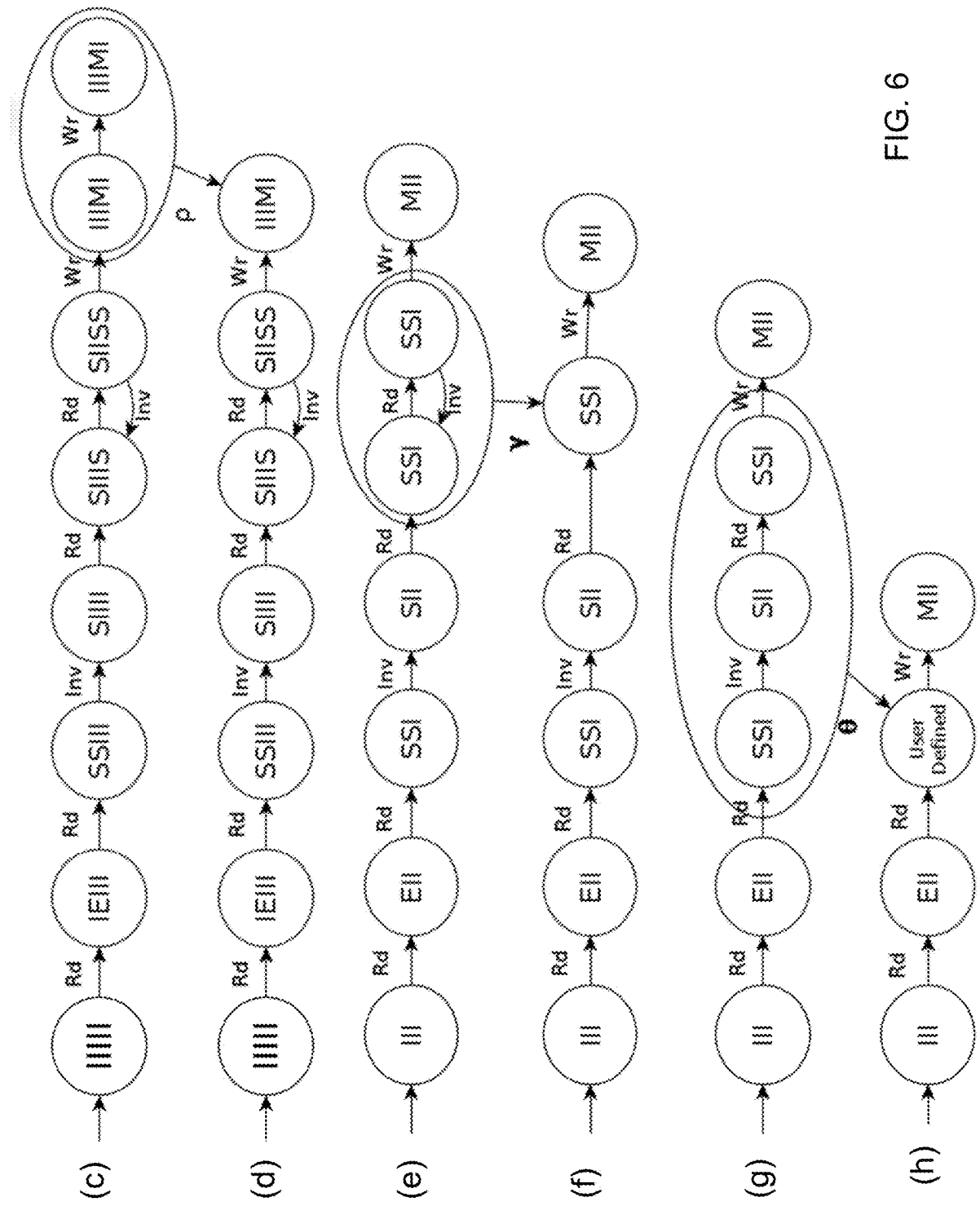
FIG. 6 illustrates an example of a set of symmetric system traces of a composition specification, according to one or more embodiments of the present disclosure.

In one or more embodiments, the simulation framework 202 is configured to process one or more simulation logs 208a of a DUT 208. The symmetric system trace extraction unit 202 is configured to extract symmetric system traces from the one or more simulation logs 208a, in which the extracted symmetric system traces may be represented in string form. In one or more embodiments, the simulation framework 202 is configured to extract the symmetric system traces from a large class of DUTs 208, in which the symmetric system traces are extracted based on one or more criteria. The simulation framework 202 can extract the symmetric system traces based on multiple criteria. For example, the simulation framework 202 can extract a symmetric system trace for a Modified Exclusive Shared Invalidate (MESI) protocol, as illustrated in FIG. 6-(c). In one or more embodiments, the trace abstraction unit 206 is configured to convert the traces to abstract traces using an abstraction algorithm. In one or more embodiments, the simulation framework 202 can compute trace-based functional coverage by maintaining a scoreboard of simulated behaviors with reference to a coverage model 212. The coverage model 212 may be a pre-computed trace coverage model. A coverage hole in the coverage model of abstract traces may represent a subset of symmetric system traces that are not covered by the test stimulus. The test stimulus 210 determines the input signals provided to the DUT 208 for the duration of the testing and/or verification process. The test stimulus 210 may also simulate the environment interactions with the DUT 208 to validate the behavior responses of the DUT 208. The results of the trace-based functional coverage, scoreboard, and one or more coverage holes may be stored in the data store 214. The data store 214 may include one or more features of the data storage repository described above.

In one or more embodiments, the trace-based system 102 provides a trace abstraction technique that can be used to efficiently compute trace-based functional coverage models for a class of communicating systems that exhibit symmetric behaviors. In one or more embodiments, in the trace-based functional coverage models, each coverage point is a trace. In one or more embodiments, the trace-based system 102 computes these trace-based coverage models given a symmetric system specification. In one or more embodiments, the trace-based system 102 provides a simulation-based framework that can be used in the development of practical symmetric systems to monitor and compute functional trace-based coverage data. In one or more embodiments, the functional trace-based coverage data may be used to guide the design and verification of such communicating systems that exhibit symmetric behaviors.

Hardware design components can be modeled as parameterized symmetric systems, i.e., a transition system based on the number of symmetric agents. One example may be a cache coherence protocol, in which each cache is indistinguishable from the others. For a given number of caches, there is a corresponding transition system that models the various states and actions for a cache line. From a trace-coverage perspective, symmetric systems may have inherent redundancy in permutations of the agents. There may also be "uninteresting" trace behaviors that may be discarded in order to create equivalence classes, from simple stuttering to more complex sequences of actions. In one or more embodiments, rewriting systems can be leveraged to reason about traces. A list of rewriting rules may provide permissible string transformations of the form (u, v), meaning that the substring u can be rewritten with v. In one or more embodiments, terminating and confluent rewriting systems (TCRSs) may apply all rewrite rules in arbitrary order that results in a deterministic and unique representative string.

Figure 3B:
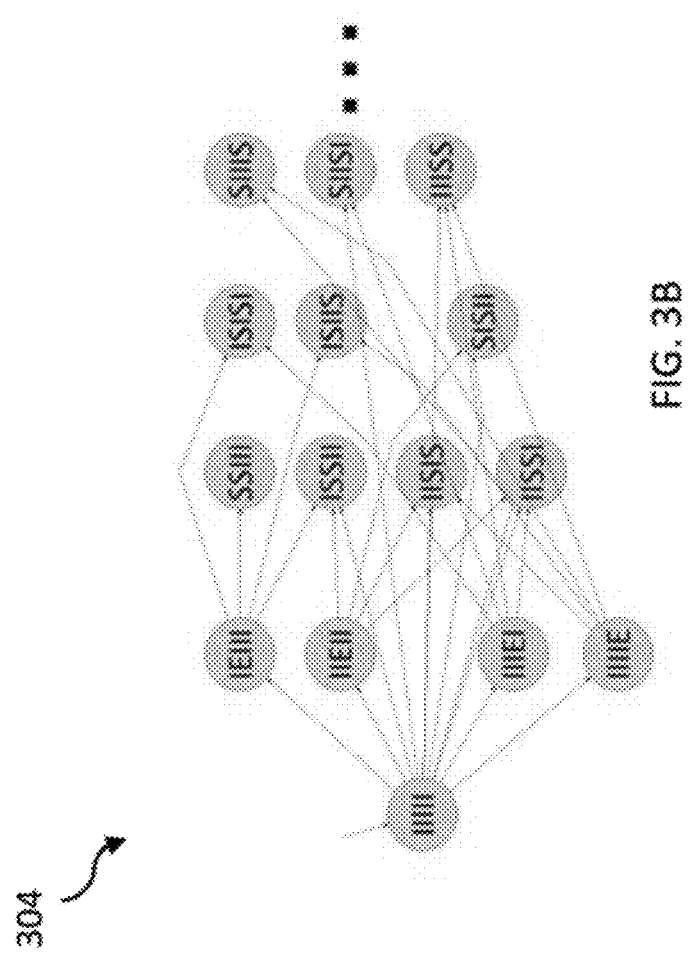
FIG. 3B illustrates a composition specification, according to one or more embodiments of the present disclosure.
Figure 3A:
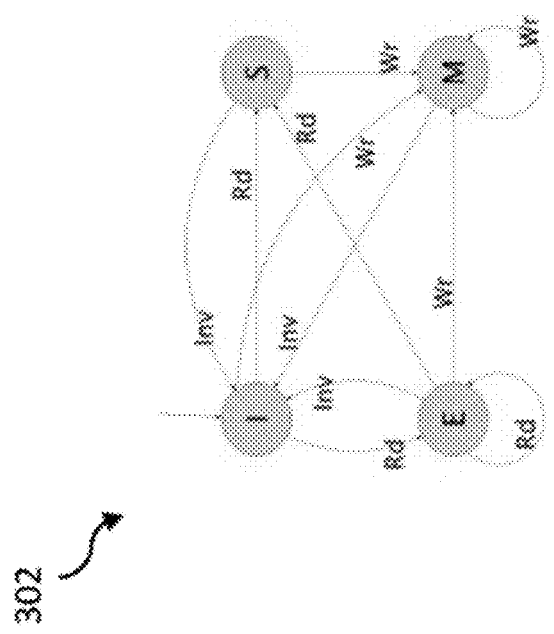
FIG. 3A illustrates a transition system specification, according to one or more embodiments of the present disclosure.

FIG. 3A illustrates a transition system specification 302, according to one or more embodiments of the present disclosure. FIG. 3B illustrates a composition specification 304, according to one or more embodiments of the present disclosure.

In one or more embodiments, the trace-based system 102 is configured to provide a symmetric system specification using the transition system specification 302 for one actor, and the composition specification for n actors. For example, FIG. 3A illustrates the transition system specification 302

("TSpec 302") for a single actor following a MESI snooping, write invalidate protocol for cache coherence, and FIG. 3B illustrates the composition specification 304 ("CSpec 304") that includes 5 actors following the MESI snooping, write invalidate protocol. The MESI snooping may be a directory-based snooping cache coherence protocol. In one or more aspects, an actor is a core of a processor. In one or more other aspects, an actor can be any computational agent that communicates with another computational agent over a protocol, for example, a MESI protocol. In FIG. 3B, "IIIII" represents that each of the 5 actors are in an invalidate state, in which each "I" corresponds to a respective actor. A change in state corresponds to a specific actor changing states. For example, an initial instance may be "IIIII" in which all 5 actors are in an invalid state, and another instance may be "IEIII" in which actors 1 and 3 through 5 are in an invalid state and actor 2 changed from an invalid state to an exclusive state "E". The grouping of states for the actors may be referred to as a c-state. The grouping of states may also be referred to as a composed system state or a representation of collective individual agent-state, in which the individuals comprise the composed system. In MESI, the individual actors change state based on the actions snooped on the bus. The state change also depends on the current state. "I" represents an invalid state; "S" represents a serve state; "E" represents an exclusive state; "M" represents a modified state; "Inv" represents an invalidate function; "Rd" represents a read function; and "Wr" represents a write function.

In one or more embodiments, the TSpec 302 followed by each actor may be defined by a set of states ($S_S$), an initial state (init), a set of actions (Act), and a transition function that illustrates state change on actions. $S_S$ can be one of the set {M, E, S, I}; init can be represented as I; Act can be one of {noop, Rd, Wr}. In one or more embodiments, the CSpec 304 can depend on the TSpec 302, the number (n) of actors in the system, and a specification of system state change based on actions of an individual actor. In one or more embodiments, the CSpec 304 can be represented as a set of all possible n-tuple of states ($S_S\hat{}n$) (hereinafter, "composed system states" or "c-states"); an initial composed system state ({init}$\hat{}$n); a subset of n-tuple actions (Act$\hat{}$n) (hereinafter, "composed actions" or "c-actions"); and a transition function that illustrates composed system state change on composed actions. Each element of the n-tuple may represent the action performed by the actor, corresponding to the index of the element, while following TSpec 302.

In one or more embodiments, the CSpec 304 may be a symmetric system specification if CSpec 304 follows that for every permutation PI on the composed-system, each transition (s, a, s') exists if and only if transition (PI(s), PI(a), PI(s')) exists. A permutation function PI may define all possible orderings of actors within a composed state. A composed system state is a symmetric system if and only if every transition is independent of the orderings of the actors in the composed state. In one or more embodiments, the trace-based system 102 may not pose restrictions to the set of composed actions in the above parameters of CSpec 304. CSpec 304 for symmetric systems may grow with n, i.e., the change to the composition function by the addition of a symmetric actor to a system of size i or size i+1.

In one or more embodiments, from the CSpec 304, the trace-based system 102 defines a symmetric system trace as a finite alternating sequence of composed system states and composed system actions that effect the change in the composed system state. That is, a trace is an alternating sequence of c-states and c-actions that begins with the initial c-state. The length of such a trace corresponds to the number of composed actions within the trace.

An example symmetric system trace for MESI protocol is illustrated in FIG. 6-(c). The string representation of the trace in FIG. 6-(c) is:
(I,I,I,I,I)→(noop, Rd, noop, noop, noop)→(I,E,I,I,I)→ (Rd, Rd, noop, noop, noop)→(S,S,I,I,I)→(noop, Inv, noop, noop, noop)→(S,I,I,I,I)→(noop, noop, noop, noop, Rd)→(S,I,I,I,S)→(noop, noop, noop, Rd, noop)→(S,I,I,S,S)→(Inv, noop, noop, Wr, Inv)→(I,I,I,M,I)→(noop, noop, noop, Wr, noop)→(I,I,I,M,I)
which can also be represented, for simplicity, as:
(I,I,I,I,I)→Rd→(I,E,I,I,I)→Rd→(S,S,I,I,I)→Inv→(S,I,I,I,I)→Rd→(S,I,I,I,S)→Rd→(S,I,I,S,S)→Wr→(I,I,I,M,I)→Wr→(I,I,I,M,I)
considering only the unique action component on the bus. The unique action component for a transition may be the action performed by the unique actor for that transition, in which all other agents "react" to the actor's action.

In one or more embodiments, the symmetric system trace extraction unit 204 defines a set of symmetric system traces of CSpec 304 as being SymTraces (tr). The symmetric system trace extraction unit 204 may define a set of symmetric system traces by identifying the set of actors and extracts the transitions performed by these actors from the simulation logs 208. Using the identified set of actors and extracted transitions with the transition system specification 302, symmetric system trace extraction unit 204 can compute the composed system states and transitions between the composed states thereby producing a set of symmetric system traces of CSpec 304 as being SymTraces (tr). The size of SymTraces may grow exponentially as the length of the traces increase.

Figure 4:
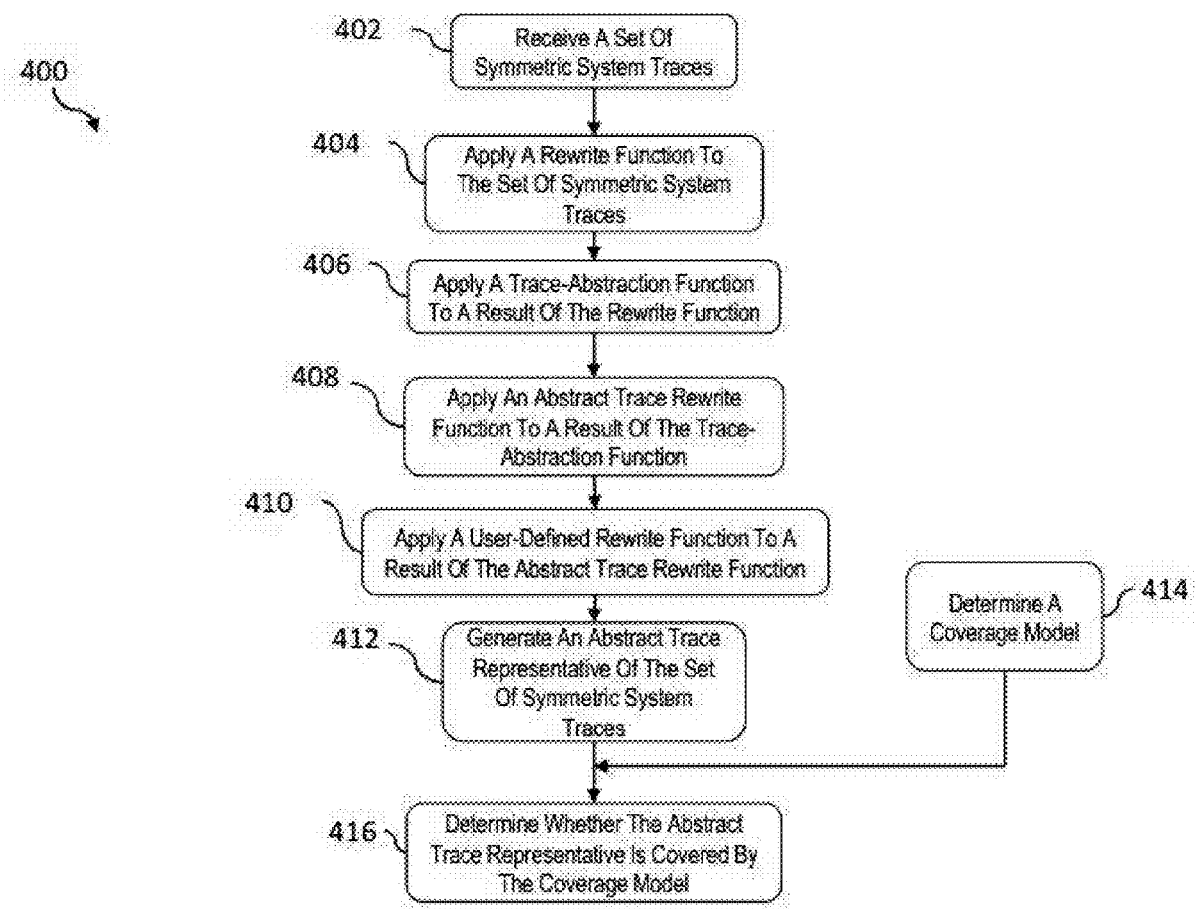
FIG. 4 is a flowchart illustrating a method of generating an abstract trace representative of a set of symmetric system traces and determining whether the generated representative exists in a coverage model, according to one or more embodiments of the present disclosure.

FIG. 4 is a flowchart illustrating a method 400 of generating an abstract trace representative of the set of symmetric system traces and determining whether the generated representative exists in a coverage model, according to one or more embodiments of the present disclosure. While the method 400 is described for the sake of convenience and not with an intent of limiting the disclosure as comprising a series and/or a number of steps, it is to be understood that the process does not need to be performed as a series of steps as shown in FIG. 4, but multiple adjacent steps can be abstracted into one functional unit that performs both the adjacent steps.

The set of string representations of members of SymTraces can be used to generate a coverage model. However, as the size of SymTraces grow exponentially with an increase in the length of the traces, merely using the set of string representations of members of SymTraces may be restricted to smaller configuration coverage models that do not provide much information for practical purposes. To address these deficiencies, the trace-based system 102 is configured to provide a trace abstraction framework that can be used to efficiently compute trace-based functional coverage models for a class of communicating systems that exhibit symmetric behaviors. In one or more embodiments, with this abstraction framework, symmetric traces of systems, having arbitrary sizes of CSpec 304 and trace lengths, can be mapped to a smaller set of representative abstract traces, which in turn can be computed from a composed system with a CSpec of smaller size. In one or more embodiments, by using a smaller set of representative abstract traces as a coverage model in conjunction with the abstraction framework, the trace-based system 102 may generate scalable trace based functional coverage models that may be practically used and analyzed.

In one or more embodiments, a set of symmetric system traces is received at 402, preferably by the trace abstraction unit 206. In one or more embodiments, the set of symmetric system traces may be defined by the symmetric system trace extraction unit 204 as being SymTraces.

In one or more embodiments, a rewrite function may be applied to the set of symmetric system traces at 404, in which the rewrite function is preferably applied by the trace abstraction unit 206. In one or more embodiments, the rewrite function may be considered a symmetric trace rewrite function (Rsym) that has been previously defined. The Rsym may be a terminating and confluent rule that rewrites symmetric system traces into another symmetric system trace. For example, the symmetric system trace illustrated in FIG. 6-(c) is rewritten to another symmetric system trace illustrated in FIG. 6-(d) using Rsym. The domain and range of Rsym may be the set of Sym Traces.

In one or more embodiments, having rewritten the Rsym, a trace-abstraction function is applied to a result of the rewrite function at 406, preferably performed by the trace abstraction unit 206. In one or more embodiments, the trace-abstraction (Tabs) function for a symmetric system trace can be defined as T=Composed State 1, Composed Action 1, Composed State 2, Composed Action 2, . . . , Composed State N. Tabs may be the point-wise application of a state abstraction function (StateAbs) and action abstraction function (ActionAbs) on the composed system states and the composed system actions, respectively, to yield the abstract trace representative of the symmetric system trace. That is, StateAbs(Composed State 1), ActionAbs(Composed Action 1), StateAbs(Composed State 2), ActionAbs(Composed Action 2), . . . , StateAbs(Composed State N) may represents the abstract trace representative or "abstract trace" of T. In one or more embodiments, StateAbs may map a composed system state to abstract composed states. In one or more embodiments, ActionAbs may map composed actions to an abstract composed action.

In one or more embodiments, an abstract trace rewrite function is applied to a result of the trace-abstraction function at 408, preferably by the trace abstraction unit 206. In one or more embodiments, the abstract trace rewrite (Rabs) function may be a terminating and confluent rule that rewrites abstract traces to another abstract trace. For example, the abstract trace illustrated in FIG. 6-(e) is rewritten to another abstract trace illustrated in FIG. 6-(f) using Rabs. The domain and range of RSym is the set of AbsSymTraces.

In one or more embodiments, having applied the Rabs function, a user-defined rewrite function is applied to a result of the Rabs function at 410, preferably by the trace abstraction unit 206. In one or more embodiments, the user-defined rewrite (Uabs) function may be a terminating and confluent user defined rule that rewrites any subsequence of an abstract trace to an arbitrary range that can be considered atomic to the user. For example, a subsequence of length greater than 1 is atomic to the user if the user would like to rewrite the subsequence of length to a subsequence of length 1. In one or more embodiments, the domain of the Uabs function is the set of AbsSymTraces, and the range of the Uabs function may be an arbitrary string. In one or more embodiments, having applied the Uabs function, an abstract trace representative of the set of symmetric system traces is generated at 412, preferably by the trace abstraction unit 206.

In one or more embodiments, a coverage model is determined at 414, preferably by the trace generator 216. In one or more embodiments, the coverage model may be determined before the trace abstraction unit 206 receives a set of symmetric system traces at 402 or in parallel with one or more of the features described with reference to 402, 404, 406, 408, 410, and 412. To determine a coverage model, the trace generator 216 takes input parameters CSpec and a length of one or more traces (i.e., k), and for the system Ref corresponding to the CSpec, e.g., InputSys, the trace generator 216 produces the sets InputSysSymTraces and AbsInputSysTraces. InputSysSymTraces may be the set of symmetric system traces of InputSys. AbsInputSysTraces may be the set of traces obtained by the abstraction technique following 402, 404, 406, 408, 410, and 412 with InputSysSymTraces. The trace generator 216 defines Ref to be a symmetric system with a CSpec of size k and determines that the sets RefSymTraces and AbsRefSymTraces represent the set of symmetric system traces and abstract traces of Ref, respectively. That is, the trace generator 216 produces RefSymTraces and AbsRefSymTraces for a particular symmetric system Ref of size k. Size k may be, for example, set X+1, in which X={X1, X2, . . . , Xm} and is further discussed below. The trace generator 216 also defines DUT to be a symmetric system with the same TSpec as Ref but with size of at least k, and determines that the sets DUTSymTraces and AbsDUTSymTraces represent the set of symmetric system traces and abstract traces of DUT, respectively. That is, with the simulation framework 202, the trace-based system 102 can compute SymTraces and AbsSymTraces for arbitrarily sized DUT(s), in which the size is at least k. The simulation framework 202 may store the coverage models in the coverage model store 212 and/or a data repository.

In one or more embodiments, the simulation framework 202 can use the set AbsRefSymTraces as the coverage model in place of DUTSymTraces if and only if the set AbsRefSymTraces is a subset of AbsDUTSymTraces. That is, for every trace in RefSymTraces, there is a trace in DUTSymTraces whose abstract trace representatives are the same. In one or more embodiments, the trace-based system 102 can determine that any coverage holes observed in the AbsRefSymTraces model guarantees that DUTSymTraces (for example, a set of pre-images of the uncovered abstract traces) have not been simulated during the development process. In one or more embodiments, the corresponding abstraction Uabs(Rabs(Tabs(Rsym(tr)))) that enforces the subset relationship satisfies the trace abstraction property for coverage.

In one or more embodiments, a determination is made at 416, preferably by the simulation framework 202, as to whether the abstract trace representative is covered by a coverage model. The simulation framework 202 may retrieve a coverage model. In one or more embodiments, the simulation framework 202 applies a membership function to the abstract trace representative to determine whether the abstract trace representative is covered by the coverage model. For the cases in which the membership function is true, the simulation framework 202 determines that the abstract trace representative is covered by the coverage model. For the cases in which the membership function is false, the simulation framework 202 determines that there is a coverage hole in the coverage model. The trace-based system 102 provides feedback to a user on a quality of the test stimulus. That is, the trace-based system 102 indicates which traces in the coverage model are covered or uncovered. A testbench and test stimulus may aim to cover all of the traces in the coverage model that includes the abstract traces. A testbench and/or test stimulus may aim to cover a subset of one or more of the most important events in the coverage model. The feedback provided by the trace-based system 102 may be used as an indication of the effectiveness of the verification process and a metric for gauging the completeness of the verification process.

In one or more embodiments, by combining rewriting functions with abstraction functions into a simulation framework, a user may be empowered to easily define coverage models. In one or more embodiments, the trace coverage information can recalibrate the design verification environment to provide more interesting multi-actor test cases. The scoreboard for each simulation can be used to distinguish multiple simulation scenarios, and therefore, can be used in defect triaging in the verification process. Moreover, the simulation logs generated by the trace-based system 102 can be used to evaluate function coverage of the coverage model.

Figure 5:
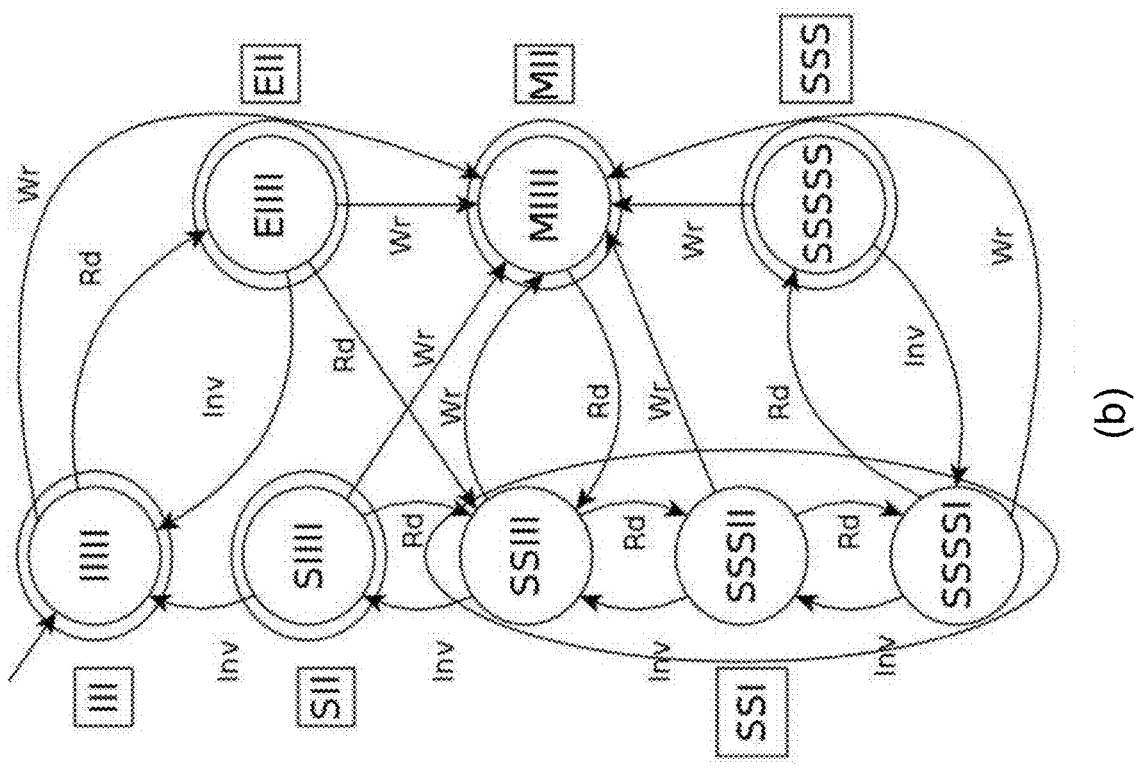
FIG. 5 illustrates an example of a composition specification and equivalence classes created by state abstraction, according to one or more embodiments of the present disclosure.
Figure 5:
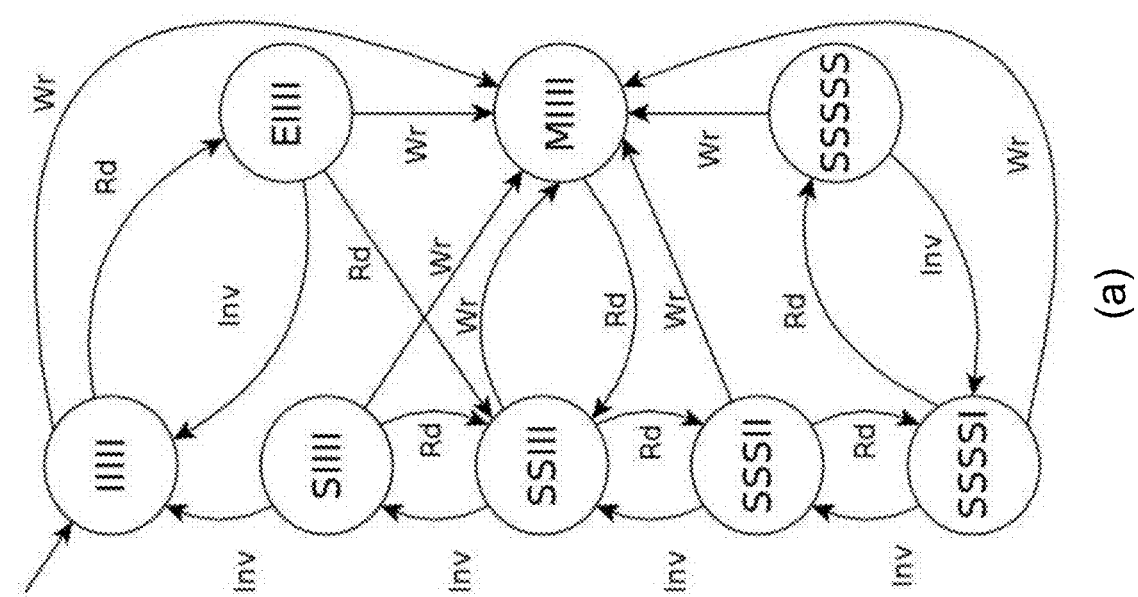

FIG. 5 illustrates an example of a composition specification and equivalence classes created by state abstraction, according to one or more embodiments of the present disclosure. FIG. 5-(a) illustrates a representation of the CSpec 304 that includes 5 actors following the MESI snooping, write invalidate protocol as illustrated in FIG. 3B. FIG. 5-(b) illustrates equivalence classes created by state abstraction. Equivalence may be a grouping of states of the composed system as defined by the state abstraction function (StateAbs). The vertices in FIG. 5-(a) and FIG. 5-(b) illustrate sets of c-states that are equal up to permutation. FIG. 6 illustrates an example of a set of symmetric system traces of a composition specification, according to one or more embodiments of the present disclosure. FIG. 6-(c) illustrates a representation of a set of CSpec 304 traces, in which each trace traverses a cycle on SIIIS and SIISS a different number of times. FIG. 6-(d) illustrates a set of CSpec 304 traces after stutter removal. FIG. 6-(e) illustrates a corresponding abstract trace after state abstraction. FIG. 6-(f) illustrates a corresponding abstract trace after abstract trace rewriting. FIG. 6-(g) and FIG. 6-(h) illustrate abstract traces before and after optional user-defined rewriting that combines consecutive abstract states representing at least one S-state and at least one I-state. The vertices in FIG. 6-(c) through FIG. 6-(d) illustrate c-states; the vertices in FIG. 6-(e) through FIG. 6-(g) illustrate abstract states; and vertex "User Defined" illustrates a representative of some abstract states. The arcs of FIG. 5(a) through FIG. 6(d) are labeled with a unique action component.

Abstractions that satisfy the trace abstraction property for coverage can exist for a class of snooping/broadcast-based write invalidate cache coherence protocols. FIGS. 5 and 6 are used to illustrate an example of an abstraction rule to determine the features of trace coverage models.

In an illustrative example, the TSpec and CSpec of these cache coherence protocols follow that (a) set of states in TSpec, $S_S$, can be partitioned into two sets X={X1, X2, ..., Xm} and Y={Y1, Y2} and a strict ranking function can define an order X1>X2> ... >Xm>Y1>Y2; (b) multiple instances of states Y1, Y2 can co-exist in the system, one Xm state can co-exist with multiple Y1, Y2, and all other X states can only co-exist with Y2; (c) the initial state of CSpec is the n-tuple (Y2, ..., Y2); and (d) any transition of the CSpec follows that: (i) reactors do not increase rank; (ii) if actor Y1 decreases rank to Y2, reactors do not change; (iii) if any actor increases rank to some X-state, reactors must change to Y2; and (iv) if actor Y2 increases rank to Y1, all reactors, other than Xm, decrease rank. For example, for the MESI cache coherence protocol, X={M, E}, Y={S, I}, and the ranking is M>E>S>I. Reactors may be agents of the composed system that respond to one or more actions performed by the actor agent.

Composed actions may be restricted such that one agent is the actor while all the others are reactors. For example, all the actors may emulate a broadcast-based communication model (for instance, on a bus), in which there are defined actions and defined reactions to actions performed by other actors. Each composed action may be viewed as any permutation of the tuple (Perform A, React to A, React to A, React to A ...), in which the unique action component A is derived from the set of actions in TSpec.

In the illustrative example, Uabs, Rabs, RSym, and Tabs are defined as described above such that the composition of Uabs(Rabs(Tabs(Rsym(tr)))) satisfies the trace abstraction property for coverage. As described above, the Rsym is a rewrite function on symmetric system traces in which subsequent stuttering actions by the same actor are removed. For example, RSym converts the trace in FIG. 6-(c) to FIG. 6-(d).

As described above, the Tabs function for a symmetric system trace T equals Composed State 1, Composed Action 1, Composed State 2, Composed Action 2, ..., Composed State N, Composed Action N which can be further defined as: StateAbs(Composed State 1), ActionAbs(Composed Action 1), StateAbs(Composed State 2), ActionAbs(Composed Action 2), ..., StateAbs(Composed State N).

State abstraction (StateAbs) function may map a composed system state to abstract states, which are strings of length m+1. For any composed system state (CompState), StateAbs determines that (a) if CompState contains a state A in set X, and A is not Xm, the abstract state can be represented as (A, Y2, Y2); (b) if CompState contains Xm, then (i) if all other actors are of same state Y1, the abstract state can be represented as (Xm, Y1, Y1); (ii) if all other actors are of same state Y2, the abstract state can be represented as (Xm, Y2, Y2); or otherwise, (iii) the abstract state can be represented as (Xm, Y1, Y2); (c) if CompState is initial state (Y2, ..., Y2), then the abstract state can be represented as (Y2, Y2, Y2); (d) if CompState is (Y1, ..., Y1), then the abstract state can be represented as (Y1, Y1, Y1); (e) if CompState contains two or more Y1 and at least one Y2, then the abstract state can be represented as (Y1, Y1, Y2); or otherwise, (f) the abstract state is (Y1, Y2, Y2). FIG. 5-(b) illustrates an example of state abstraction function.

An action abstraction (ActionAbs) function may map composed actions to their unique action component. For example, the Tabs function may convert traces as shown in FIG. 6-(d) to FIG. 6-(e).

As describe above, the Rabs function is a terminating and confluent rewrite rule that removes subsequences in abstract traces, in which the action does not change the abstract state. For example, the Rabs function converts traces as shown in FIG. 6-(e) to FIG. 6-(f). As described above, the Uabs function is a user defined function that maps any subsequence of an abstract trace to an arbitrary range that can be considered atomic to the user. For example, the Uabs function converts traces as shown in FIG. 6-(g) to FIG. 6-(h).

While the illustrative embodiments described above are preferably implemented in hardware, such as in units and circuitry of a processor, various aspects of the illustrative embodiments may be implemented in software as well. For example, it will be understood that each block of the flowchart illustrations in FIG. 4, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions, and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

In one or more embodiments, a method of providing a trace abstraction framework to compute trace-based functional coverage models includes receiving a set of traces. In one or more embodiments, the method includes rewriting a trace of the set of traces into a second trace. In one or more embodiments, the method includes abstracting the second trace. In one or more embodiments, the method includes rewriting the abstracted second trace. In one or more embodiments, the method includes generating an abstract trace representative of the trace from the set of traces.

In one or more embodiments, a computer program product includes a non-transitory computer-readable storage medium having program instructions embodied therewith for providing a trace abstraction framework to compute trace-based functional coverage models, the program instructions executable by one or more processors. The program instructions in an embodiment includes receiving a set of traces. The program instructions in an embodiment includes rewriting a trace of the set of traces into a second trace. The program instructions in an embodiment includes abstracting the second trace. The program instructions in an embodiment includes rewriting the abstracted second trace. The program instructions in an embodiment includes generating an abstract trace representative of the trace from the set of traces.

In one or more embodiments, trace-based apparatus for providing a trace abstraction framework to compute trace-based functional coverage models includes memory having program instructions embodied therewith, and at least one processor configured to read the program instructions. In an embodiment, the at least one processor is configured to read the program instructions to execute a trace abstraction unit configured to receive a set of traces, to rewrite a trace of the set of traces into a second trace, to abstract the second trace, to rewrite the abstracted second trace, and to generate an abstract trace representative of the trace from the set of traces.

One or more embodiments of the present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer programs products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

The corresponding structures, materials, acts, and equivalents of all means or step plus function elements in the claims below are intended to include any structure, material, or act for performing the function in combination with other claimed elements as specifically claimed. The description of the embodiments of the present disclosure has been presented for purposes of illustration and description, but is not intended to be exhaustive or limited to the embodiments in the form disclosed. Many modifications and variations will be apparent to those of ordinary skill in the art without departing from the scope and spirit of the disclosure. The embodiments and examples were chosen and described in order to best explain the principles of the disclosure and the practical application, and to enable others of ordinary skill in the art to understand the disclosure for various embodiments with various modifications as are suited to the particular use contemplated.

The programs described herein are identified based upon the application for which they are implemented in a specific embodiment of the disclosure. However, it should be appreciated that any particular program nomenclature herein is used merely for convenience, and thus the disclosure should not be limited to use solely in any specific application identified and/or implied by such nomenclature.

It will be clear that the various features of the foregoing systems and/or methodologies may be combined in any way, creating a plurality of combinations from the descriptions presented above.

It will be further appreciated that embodiments of the present disclosure may be provided in the form of a service deployed on behalf of a customer to offer service on demand.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A processor-based method of providing a trace abstraction framework to compute trace-based functional coverage models in a hardware simulation environment, the processor-based method comprising:
   performing simulation on a Design Under Test (DUT) using test stimulus to generate simulation logs;
   transmitting the simulation logs to the hardware environment comprising a processor;
   receiving, by the processor, a set of traces, wherein each trace represents an alternating sequence of composed system states and composed actions of the DUT;
   rewriting, by the processor, a first trace from the set of traces into a second trace;
   abstracting the second trace by the processor;
   rewriting the abstracted second trace by the processor; and generating, by the processor, an abstract trace representative of the first trace from the set of traces.

2. The method of claim 1, wherein the set of traces comprise a set of symmetric system traces.

3. The method of claim 2, wherein the rewriting, by the processor, the first trace comprises a symmetric trace rewrite function that is a terminating and confluent rule that rewrites, by the processor, the symmetric system trace into another symmetric system trace.

4. The method of claim 1, wherein rewriting the abstracted second trace by the processor comprises an abstract trace rewrite function that is a terminating and confluent rule that rewrites, by the processor, the abstracted second trace into a third abstract trace.

5. The method of claim 1, further comprising rewriting the abstracted second trace by the processor using a user-defined rewrite function,
wherein the user-defined rewrite function is a terminating and confluent user defined rule that rewrites, by the processor, any subsequence of the abstracted second trace to an arbitrary range that can be considered atomic to the user.

6. The method of claim 1, further comprising determining, by the processor, whether the abstract trace representative is covered by a coverage model.

7. The method of claim 6, further comprising determining, by the processor, in response to determining that the abstract trace representative is not covered by the coverage model, that there is a coverage hole in the coverage model.

8. A computer program product comprising:
a non-transitory computer-readable storage medium having program instructions embodied therewith for providing a trace abstraction framework to compute trace-based functional coverage models in a hardware simulation environment comprising performing simulation on a design-under-test (DUT) using test stimulus to generate simulation logs and transmitting the simulation logs to the hardware simulation environment that comprises one or more processors, the program instructions executable by the one or more processors, the program instructions comprising:
receiving, in response to the program instructions being executed by the one or more processors, a set of traces, wherein each trace represents an alternating sequence of composed system states and composed actions of the DUT;
rewriting, in response to the program instructions being executed by the one or more processors, a first trace from the set of traces into a second trace;
abstracting, in response to the program instructions being executed by the one or more processors, the second trace;
rewriting, in response to the program instructions being executed by the one or more processors, the abstracted second trace; and
generating, in response to the program instructions being executed by the one or more processors, an abstract trace representative of the first trace from the set of traces.

9. The computer program product of claim 8, wherein the set of traces comprise a set of symmetric system traces.

10. The computer program product of claim 9, wherein the rewriting, in response to the program instructions being executed by the one or more processors, the trace comprises a symmetric trace rewrite function that is a terminating and confluent rule that rewrites, in response to the program instructions being executed by the one or more processors, the symmetric system trace into another symmetric system trace.

11. The computer program product of claim 8, wherein rewriting, in response to the program instructions being executed by the one or more processors, the abstracted second trace comprises an abstract trace rewrite function that is a terminating and confluent rule that rewrites, in response to the program instructions being executed by the one or more processors, the abstracted second trace into a third abstract trace.

12. The computer program product of claim 8, wherein the program instructions further comprise rewriting, in response to the program instructions being executed by the one or more processors, the abstracted second trace using a user-defined rewrite function,
wherein the user-defined rewrite function is a terminating and confluent user defined rule that rewrites, in response to the program instructions being executed by the one or more processors, any subsequence of the abstracted second trace to an arbitrary range that can be considered atomic to the user.

13. The computer program product of claim 8, wherein the program instructions further comprise determining, in response to the program instructions being executed by the one or more processors, whether the abstract trace representative is covered by a coverage model.

14. The computer program product of claim 13, wherein the program instructions further comprise determining, in response to the program instructions being executed by the one or more processors, in response to determining that the abstract trace representative is not covered by the coverage model, that there is a coverage hole in the coverage model.

15. A trace-based apparatus for providing a trace abstraction framework to compute trace-based functional coverage models in a hardware simulation environment, the simulation environment comprising a trace abstraction unit; the apparatus comprising:
a non-transitory processor readable memory having program instructions embodied therewith, and
at least one processor configured to read the program instructions to execute a trace abstraction unit configured to:
perform simulation on a design-under-test (DUT) using test stimulus to generate simulation logs;
transmit the simulation logs to the hardware simulation environment;
receive, by the at least one processor, a set of traces, wherein each trace represents an alternating sequence of composed system states and composed actions of the DUT,
rewrite, by the at least one processor, a first trace from the set of traces into a second trace,
abstract, by the at least one processor, the second trace,
rewrite, by the at least one processor, the abstracted second trace, and
generate, by the at least one processor, an abstract trace representative of the first trace from the set of traces.

16. The apparatus of claim 15, wherein the set of traces comprise a set of symmetric system traces.

17. The apparatus of claim 16, wherein the rewriting, by the at least one processor, the first trace comprises a symmetric trace rewrite function that is a terminating and confluent rule, the trace abstraction unit being further configured to rewrite, by the at least one processor, the symmetric system trace into another symmetric trace.

18. The apparatus of claim 15, wherein rewriting, by the at least one processor, the abstracted second trace comprises an abstract trace rewrite function that is a terminating and confluent rule, the trace abstraction unit being further configured to rewrite, by the at least one processor, the abstracted second trace into a third abstract trace.

19. The apparatus of claim 15, wherein the trace abstraction unit is further configured to rewrite, by the at least one processor, the abstracted second trace using a user-defined rewrite function.

20. The apparatus of claim 19, wherein the user-defined rewrite function is a terminating and confluent user defined rule, the trace abstraction unit being further configured to rewrite, by the at least one processor, any subsequence of the abstracted second trace to an arbitrary range that can be considered atomic to the user.

* * * * *